United States Patent [19]

Kajimura et al.

[11] 4,288,757

[45] Sep. 8, 1981

[54] SEMICONDUCTOR LASER DEVICE

[75] Inventors: Takashi Kajimura, Hachioji; Motohisa Hirao, Tokyo; Michiharu Nakamura, Hinodemachi; Takao Kuroda, Kokubunji; Shigeo Yamashita; Jun-Ichi Umeda, both of Hachioji, all of Japan

[73] Assignee: Hitachi, Ltd., Tokyo, Japan

[21] Appl. No.: 56,360

[22] Filed: Jul. 10, 1979

[30] Foreign Application Priority Data

Jul. 10, 1978 [JP] Japan ........................... 53-83014

[51] Int. Cl.$^3$ .............................................. H01S 3/19
[52] U.S. Cl. ................... 331/94.5 H; 357/16; 357/17
[58] Field of Search ............... 331/94.5 H; 357/16–18, 357/61

[56] References Cited

PUBLICATIONS

J. Coleman et al., "Liquid Phase Epitaxial $In_{i-x}$ Gax $P_{i-z}Asz/GaAs_{i-y}Py$ Heterojunction Lasers", IEEE J. of Quantum Electronics, vol. QE-11, No. 7, Jul. 1975, pp. 471–476.

J. Coleman et al., "Yellow $In_{i-x}Gax\ Pt_{i-z}Asz$ Double-Heterojunction Lasers," Journal of Applied Physics, vol. 47, No. 5, May 1976, pp. 2015–2019.

P. Wright et al., "$In_{i-x}Gax\ P_{i-z}Asz$ Double-Heterojunction-Laser Operation (77°K., yellow) in an External Grating Cavity," J. of Applied Physics, vol. 47, No. 8, Aug. 1976, pp. 3580–3586.

J. Coleman et al., "Pulsed Room–Temperature Operating of $In_{i-x}GaxP_{i-z}Asz$ Double Heterojunction Lasers, at High Energy 16470Å, 1.916ev)", Applied Physics Letters, vol. 29, No. 3, 1 Aug. 1976, pp. 167–169.

J. Coleman et al., "Room–Temperature Visible $In_{i-x}-GaxP_{i-z}As(x\lesssim 1,z\sim 0.6)$ Heterojunction Lasers," Conference Proceedings of the 6th International Symposium on Gallium Arsenide and Related Compounds, Edinburgh, Scotland, 20–22, Sep. 1976, pp. 339–345.

Primary Examiner—James W. Davie
Attorney, Agent, or Firm—Craig and Antonelli

[57] ABSTRACT

In certain applications, it is desirable to have a semiconductor laser device having shorter wave lengths of oscillation than are possible with conventional semiconductor lasers. To accomplish this, a semiconductor laser device is formed having a double-hetero structure, which comprises a semiconductor substrate composed of a GaAsP crystal, a first cladding layer formed on the substrate and composed of a GaAlAsP crystal of one conducting type, an active layer formed on the first cladding layer and composed of GaInAsP crystal, and a second cladding layer formed on the active layer and composed of a GaAlAsP crystal of the conducting type reverse to that of the first cladding layer. The cladding layers disposed on both sides of the active layer have a lower refractivity and a larger band gap than the active layer.

6 Claims, 10 Drawing Figures

SEMICONDUCTOR LASER DEVICE

BACKGROUND OF THE INVENTION

(1) Field of the Invention

The present invention relates to a semiconductor laser device having an oscillation wave length in the short wave length region.

(2) Description of the Prior Art

Visualization by a semiconductor laser device is expected as a device capable of utilizing practically a small-size high-efficiency light source instead of a conventional He-Ne gas laser device in fields of optical information processing devices, video disks and the like.

Typical instances of semiconductor laser devices heretofore proposed are as follows.

(1) A device using GaAlAs for an active layer and a cladding layer, proposed by, for example, I. Landany and H. Kressel in 1976 IEDM Technical Digest.

(2) A device using GaAsP for an active layer and GaInP for a cladding layer, proposed by, for example, H. Kressel et al. in Applied Physics Letters, Vol. 30, No. 5, 1977, pages 249-251.

In the conventional device (1), the oscillation wave length is above 710 nm in a case of continuous oscillation at room temperature, and in the conventional device (2), the oscillation wave length is above 700 nm in a case of continuous oscillation at room temperature. In other words, continuous oscillation at room temperature is impossible at an oscillation wave length below the above critical level. The reason is that in order to obtain practical oscillation, it is required that the band gap of the active layer should be sufficiently smaller than that of the cladding layer and a direct transition area should be formed.

SUMMARY OF THE INVENTION

It is therefore a primary object of the present invention to provide a semiconductor laser device suitable for shortening the oscillation wave length. According to the present invention, continuous oscillation can be performed very easily at an oscillation wave length of an order of 0.6 μm.

In accordance with the present invention, there is provided a semiconductor laser device having a doublehetero structure, which comprises a semiconductor substrate composed of a GaAsP crystal, a first cladding layer formed on the substrate and composed of a GaAlAsP crystal of one conducting type, an active layer formed on the first cladding layer and composed of a GaAlAsP crystal, and a second cladding layer formed on the active layer and composed of a GaAlAsP crystal of the conducting type reverse to that of the first cladding layer. Naturally, the regions where laser oscillation or optical modulation is carried out, that is, the cladding layers disposed on both the sides of the active layer, have a lower refractivity and a larger band gap than in the active layer.

DETAILED DESCRIPTION OF THE PREFERRED EMBODIMENTS

The present invention will now be described in detail by reference to specific embodiments.

Figure 1:
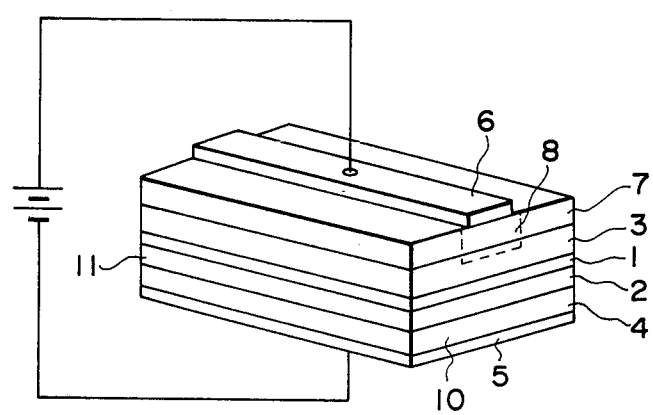
FIG. 1 is a perspective view illustrating a typical example of the semiconductor laser device of the present invention.

FIG. 1 is a perspective view illustrating the basic structure of the semiconductor laser device of the present invention.

The active layer 1 is composed of Ga$_y$In$_{1-y}$As$_x$P$_{1-x}$ and the cladding layers 2 and 3 are composed of n-Ga$_p$Al$_{1-p}$As$_q$P$_{1-q}$ and p-Ga$_{p'}$Al$_{1-p'}$As$_{q'}$P$_{1-q'}$, respectively. GaAs$_t$P$_{1-t}$ is used for the semiconductor substrate 4.

Oscillation of the semiconductor laser device at room temperature is made possible when the compositions of the above semiconductors layers are selected so that the requirements of $0.52 \leq y \leq 1.0$, $0 \leq x \leq 1.0$, $0 \leq p \leq 0.91$, $0 \leq p' \leq 0.91$, $0.47 \leq q \leq 1.0$, $0.47 \leq q' \leq 1.0$ and $0.54 \leq t \leq 1$ are satisfied.

In a combination of the materials satisfying the above requirements, it is made possible to form a large band gap in each cladding layer, and therefore, the intended shortening of the oscillation wave length can easily be attained.

The compositions of the respective semiconductor layers will now be described in detail.

A crystal having a composition GaAs$_t$P$_{1-t}$ ($0.54 \leq t < 1.0$) is used for the semiconductor substrate 4.

It is indispensable that the lattice constants of the respective layers to be laminated should be made to approximate to the lattice constant a of the semiconductor substrate 4. The lattice constant a of a GaAs crystal is 5.653 Å.

Figure 2:
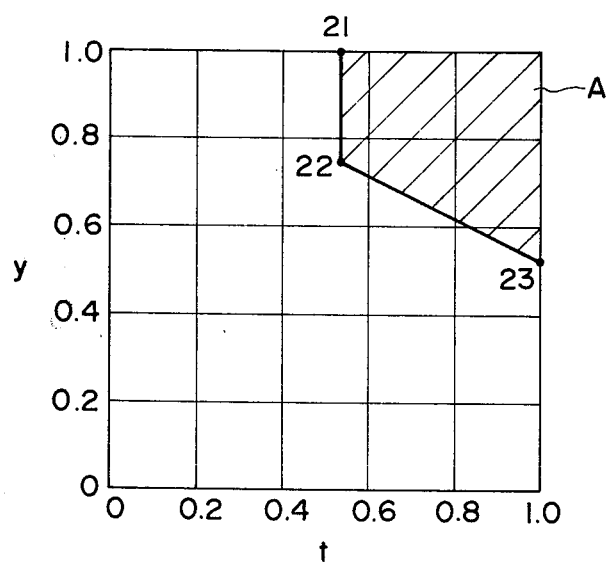
FIG. 2 is a diagram illustrating the relation between the value of t in the GaAs$_t$P$_{1-t}$ crystal substrate and the amount y of Ga in the active layer, which enables matching of lattice constants of the respective layers.
Figure 3:
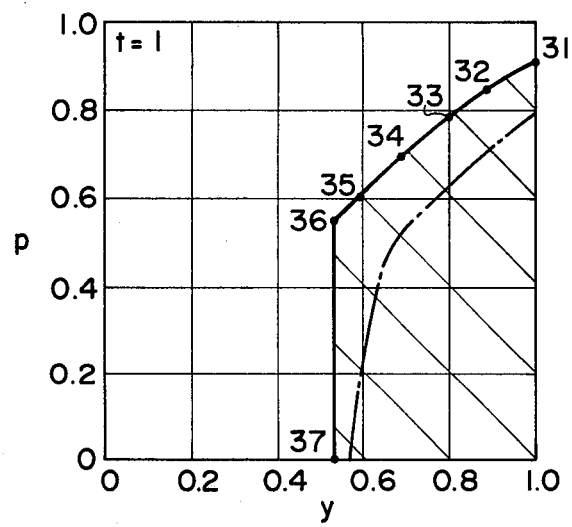
FIGS. 3 through 7 are diagrams illustrating the relation between the amount y of Ga in the active layer and the amount p of Ga in the cladding layer in the case where a GaAs$_t$P$_{1-t}$ crystal having a value t of 1, 0.98, 0.9, 0.75 or 0.6, respectively is used for the substrate.
Figure 4:
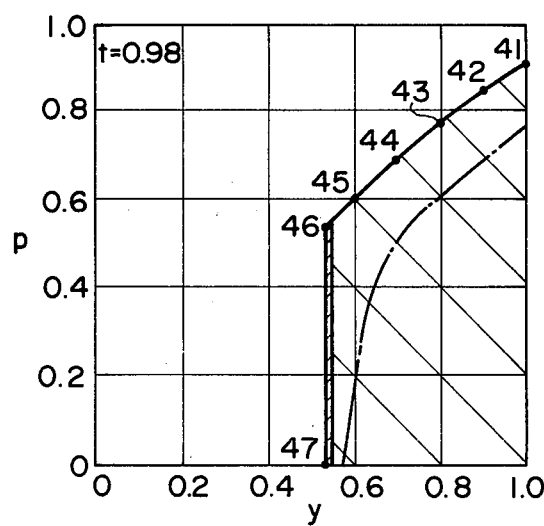
Figure 5:
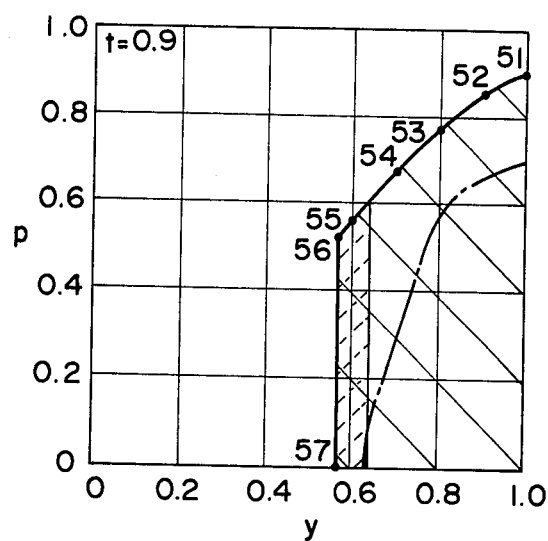
Figure 6:
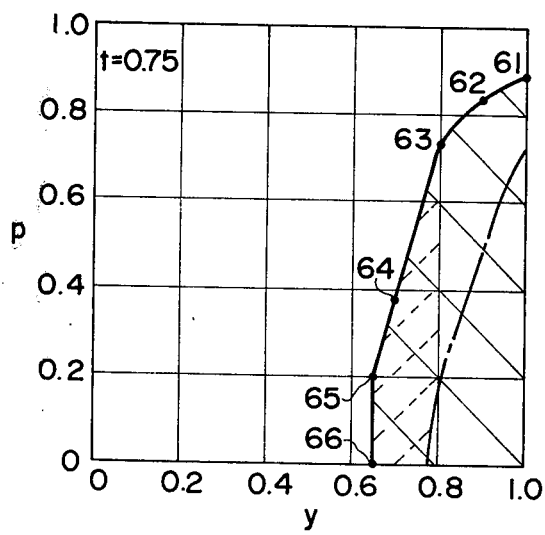
Figure 7:
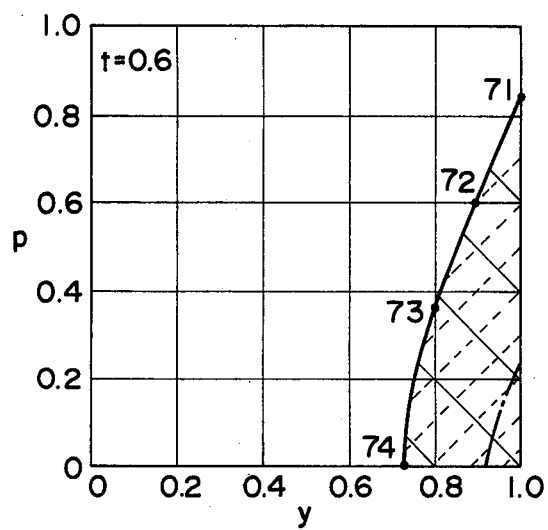

If the amount y in the active layer 1 composed of Ga$_y$In$_{1-y}$As$_x$P$_{1-x}$ is set in the region A shown in FIG. 2, matching of the lattice constants of the respective layers becomes possible. When a GaAsP substrate is employed, matching is possible in the region of y$_0 \leq y \leq 1$. The coordinates of points 21 to 23 in FIG. 2 are as shown in Table 1.

TABLE 1

| Point | t | yφ |
|---|---|---|
| 21 | 0.54 | 1.0 |
| 22 | 0.54 | 0.74 |
| 23 | 1.0 | 0.525 |

The region shown in FIG. 2 is a critical region where lattice matching of the respective layers is possible and the active layer is made of the direct transition type.

Also the value x should satisfy the requirements represented by the following formulae for matching of the lattice constants:

$$|x-x_0| \leq \Delta x \qquad (1)$$

and $$x_0 = \frac{a - 5.87 + 0.42y}{0.18 + 0.02y} \qquad (2)$$

wherein a stands for the lattice constant of the substrate crystal.

In the above formulae, $\Delta x$ corresponds to an allowance of non-matching and is empirically up to 0.02, and x is selected within a range of from 0 to 1.0.

In $Ga_pAl_{1-p}As_qP_{1-q}$ (or $Ga_{p'}Al_{1-p'}As_{q'}P_{1-q'}$) of the cladding layer, in order to enable the operation of the semiconductor laser device at room temperature, the amount of Ga is set within a range described below. The region of the amount p or p' of Ga in the cladding layer with respect to the amount y of Ga in the active layer 1 is shown in FIGS. 3 through 7. (In each FIG., p is indicated on the ordinate and also p' is similarly indicated.) FIGS. 3, 4, 5, 6 and 7 show the relations between y and p in cases of t=1, t=0.98, t=0.9, t=0.75 and t=0.6, respectively. The amount p of Ga in the cladding layer is included in a hatched region with respect to the amount y of Ga in the active layer 1 according to the indicated substrate. From the practical viewpoint, selection of the amounts p and y of Ga with respect to other values of t can be determined by interpolating values shown in the drawings. In the region hatched by dot lines, oscillation of a wave length of $\lambda \leq 647$ Å becomes possible.

The coordinates of the boundaries of the regions shown in FIGS. 3 through 7 are shown in Table 2.

TABLE 2

| γ | p | γ | p |
| --- | --- | --- | --- |
| 31 | 1.0 | 0.91 | 41 | 1.0 | 0.91 |
| 32 | 0.9 | 0.84 | 42 | 0.9 | 0.84 |
| 33 | 0.8 | 0.77 | 43 | 0.8 | 0.77 |
| 34 | 0.7 | 0.70 | 44 | 0.7 | 0.69 |
| 35 | 0.6 | 0.62 | 45 | 0.6 | 0.60 |
| 36 | 0.52 | 0.54 | 46 | 0.54 | 0.53 |
| 37 | 0.52 | 0 | 47 | 0.54 | 0 |
| 51 | 1.0 | 0.90 | 61 | 1.0 | 0.90 |
| 52 | 0.9 | 0.83 | 62 | 0.9 | 0.83 |
| 53 | 0.8 | 0.76 | 63 | 0.8 | 0.70 |
| 54 | 0.7 | 0.66 | 64 | 0.7 | 0.38 |
| 55 | 0.6 | 0.54 | 65 | 0.64 | 0.19 |
| 56 | 0.57 | 0.51 | 66 | 0.64 | 0 |
| 57 | 0.57 | 0 | | | |
| 71 | 1.0 | 0.82 | | | |
| 72 | 0.9 | 0.62 | | | |
| 73 | 0.8 | 0.36 | | | |
| 74 | 0.71 | 0 | | | |

Figure 8:
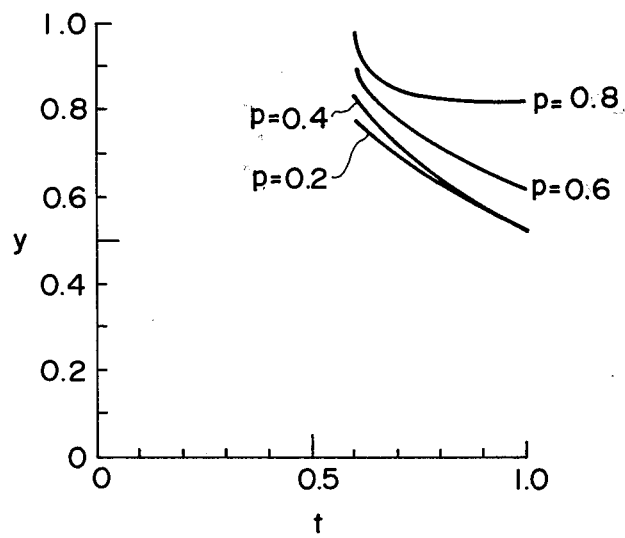
FIG. 8 is a diagram illustrating the relation between the amount t of As in the substrate and the amount y of Ga in the active layer with the amount p of Ga in the cladding layer being used as a parameter.

FIG. 8 is a diagram illustrating the relation between the amount y of Ga in the active layer and the amount of As in the substrate with the amount p of Ga in the cladding layer being used as a parameter.

From the viewpoint of matching of the lattice constants, the requirements represent by the following formulae should be satisfied:

$$|q - q_0| \leq \Delta q \qquad (4)$$

and $$q_0 = \frac{a - 5.4625 + 0.013p}{0.198 + 0.0044p} \qquad (5)$$

In the above formulae, $\Delta q$ corresponds to an allowance of non-matching and is empirically up to 0.02, and q is selected within a range of from 0 to 1.0.

The band gap Eg of the active layer is represented by the following formula:

$$Eg = 1.35 - x + 1.4y - 0.33 \, x \, y \qquad (3)$$
$$- (0.738 - 0.28x) \, y \, (1 - y)$$
$$- (0.101 + 0.109y) \, x \, (1 - x)$$

If the compositions are set as described above, it is made possible that the band gap of the cladding layer is larger by at least 0.1 eV than the band gap of the active layer 1 and it is also made possible to operate the semiconductor laser device continuously at room temperature. Further, in the region defined by the chain line and axes of the coordinates, the above difference can be made larger than 0.3 eV.

The following advantages are attained when the difference between the band gap of the cladding layer and the band gap of the active layer is at least 0.3 eV.

(1) The threshold current value can be remarkably reduced. When the above difference of the band gap is set at 0.3 eV, the threshold current value is reduced to about ⅓ of the threshold current value obtained when the band gap difference is 0.1 eV.

(2) The stability of the threshold current density Jth to ambient temperatures can be increased. Generally, the threshold current density Jth is represented by the following formula:

$$Jth = J_0 \exp(T/T_0)$$

wherein Jo stands for a constant and T stands for the ambient temperature (K).

The value of To is changed depending on the above-mentioned band gap difference between the cladding layer and the active layer. The temperature characteristic of Jth is stabilized in the region of To(0.1 ev)=30-50 K or To(0.3 eV)=80-150 K.

From the viewpoint of the ease of operation, it is preferred that the compositions of the two cladding layers sandwiching the active layer be the same, but of course, different compositions may be adopted.

The thickness of the active layer is from 0.05 to 3.0 μm, preferably 0.1 to 1.0 μm, and the thickness of the cladding layer is anywhere from 0.05 μm to scores of μm, preferably 1 to 10 μm.

An example in which a GaAsP crystal is used for the semiconductor substrate will now be described by reference to FIG. 1. A layer 2 of $n-Ga_pAl_{1-p}As_qP_{1-q}$, a layer 1 of $Ga_yIn_{1-y}As_xP_{1-x}$, a layer 3 of $p-Ga_{p'}Al_{1-p'}As_{q'}P_{1-q'}$ and a layer 7 of $GaAs_tP_{1-t}$ are formed in sequence on a substrate 4 of $GaAs_tP_{1-t}$ (p is practically above 0.6) having a plane (100) on the surface according to a known liquid phase epitaxial method using a slide boat. A semiconductor having a plane (111) on the surface can also be used.

A solution for growth of the GaAlAsP layer is formed by adding GaAs, Al and GaP to a Ga solution. The amounts added of these components are adjusted so that a desirable composition is formed. A solution for growth of the GaInAsP layer is formed by adding GaAs, Ga and GaP in an In solution, and a solution for growth of GaAsP layer is formed by adding GaAs and GaP to a Ga solution. The temperatures of these solutions are elevated to about 750° C. and while the solutions are being cooled at a rate of 0.1° to 1° C./min, the substrate is contacted with these solutions in sequence.

The compositions of the respective layers are shown in Table 3.

TABLE 3

| Sample No. | | Compositions | Dopant | Thickness (μm) | Oscillation Wave Length (nm) |
|---|---|---|---|---|---|
| 1 | layer 2 | $Ga_{0.34}Al_{0.66}As_{0.86}P_{0.14}$ | Te | 3 | |
| | layer 1 | $Ga_{0.7}In_{0.3}As_{0.28}P_{0.72}$ | undoped | ~0.2 | |
| | layer 3 | $Ga_{0.34}Al_{0.66}As_{0.86}P_{0.14}$ | Zn | 3 | 689 |
| | layer 7 | $GaAs_{0.9}P_{0.1}$ | Te | 1 | |
| | layer 4 | $GaAs_{0.9}P_{0.1}$ | Te | 100 | |
| 2 | layer 2 | $Ga_{0.18}Al_{0.82}As_{0.7}P_{0.3}$ | Te | 3 | |
| | layer 1 | $Ga_{0.72}In_{0.28}As_{0.16}P_{0.84}$ | undoped | ~0.2 | |
| | layer 3 | $Ga_{0.18}Al_{0.82}As_{0.7}P_{0.3}$ | Zn | 3 | 620 |
| | layer 7 | $GaAs_{0.74}P_{0.26}$ | Te | 1 | |
| | layer 4 | $GaAs_{0.74}P_{0.26}$ | Te | 100 | |
| 3 | layer 2 | $Ga_{0.32}Al_{0.68}As_{0.56}P_{0.44}$ | Te | 3 | |
| | layer 1 | $Ga_{0.89}In_{0.11}As_{0.35}P_{0.65}$ | undoped | ~0.2 | |
| | layer 3 | $Ga_{0.32}Al_{0.68}As_{0.56}P_{0.44}$ | Zn | 3 | 620 |
| | layer 7 | $GaAs_{0.6}P_{0.4}$ | Te | 1 | |
| | layer 4 | $GaAs_{0.6}P_{0.4}$ | Te | 100 | |

After the above-mentioned steps, for example, an $Al_2O_3$ layer is formed on the top face of the GaAsP layer 7 to form a window of a predetermined shape having a width of 5 μm. Zn is diffused through this window to form a Zn-diffused region 8. The stripe width is 1 to 20 μm as in the conventional devices. After removal of the $Al_2O_3$ film, Au, Cr and Au-Ge-Ni alloy are vacuum-deposited as positive and negative poles 6 and 5. The crystal is cleft on the plane (110) to obtain parallel planes and form reflection planes for oscillation. The cavity length is 300 μm.

Oscillation at room temperature is possible in the semiconductor laser devices of samples Nos. 1 to 3. The threshold current density is 5 to 7 $kA/cm^2$.

As seen from the data shown in Table 3, according to the present invention, oscillation becomes possible in a short wave length region where oscillation is impossible according to the conventional techniques.

The cladding layers sandwiching the active layer may be asymmetric with respect to the thickness and the like. Moreover, the arrangement of the n- and p-types may be reversed to that shown in the above embodiment. In the above embodiment, the active layer is undoped. Of course, the active layer may be doped with an impurity. Also in this case, the intended object of the present invention can be attained.

The most characteristic feature of the present invention resides in a double-hetero structure for obtaining a semiconductor laser device capable of oscillation in a short wave length region. Accordingly, various modifications can be made for stabilizing the laser oscillation. For example, the following modification can be mentioned.

Figure 9:
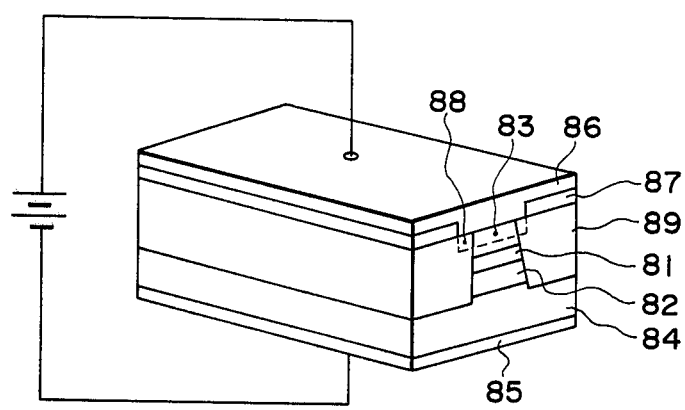
FIGS. 9 and 10 are perspective views illustrating other examples of the semiconductor laser device of the present invention.

In a simple double-hetero structure, in the longitudinal direction (the direction vertical to the hetero junction face), the refractivity varies but in the lateral direction (the direction parallel to the hetero junction face), there is no difference of the refractivity. In contrast, according to the present invention, mesa etching is conducted on the crystal surface parallel to the hetero junction face of the double-hetero structure to form a band-like mesa region acting as the active region. In this case, it is preferred that the band-like active region is surrounded by a semiconductor layer having a refractivity lower than that of the active region. An example is illustrated in FIG. 9. A substrate 84 is composed of GaAsP, a first conducting type layer 82 is composed of $Ga_pAl_{1-p}As_qP_{1-q}$ ($0 \leq p \leq 0.91$ and $0.47 \leq q \leq 1.0$), an active layer 81 is composed of $Ga_yIn_{1-y}As_xP_{1-x}$ ($0.52 \leq y \leq 1.0$ and $0 \leq x \leq 1.0$), and a layer 83 of the conducting type reverse to that of the layer 82 is composed of $Ga_{p'}Al_{1-p'}As_{q'}P_{1-q'}$ ($0 \leq p' \leq 0.91$ and $0.47 \leq q' \leq 1.0$), and the double-hetero structure is constructed by these layers. The layers 82, 81 and 83 are grown on the substrate 84 according to a known liquid phase epitaxial method, and etching is carried out so that a desirable stripe width is obtained. Then, layers 89 of $Ga_{p''}Al_{1-p''}As_{q''}-P_{1-q''}$ ($0 \leq p'' \leq 0.91$ and $0.47 \leq q'' \leq 1.0$) are grown to sandwich the band-like double-hetero structure from both the sides. Positive and negative poles 85 and 86 are formed by vacuum deposition of metals. Reference numerals 87 and 88 represent an insulating layer of $SiO_2$ or the like and a Zn-diffused layer formed by diffusing Zn through a window of the insulating layer, respectively. If there is adopted this structure in which an active region having a high refractivity is embedded in a layer having a low refractivity, there can be obtained a semiconductor laser device in which optical transmission, laser oscillation or optical modulation can be performed with good characteristics while reducing the loss.

Another modification for stabilizing laser oscillation will now be described.

Figure 10:
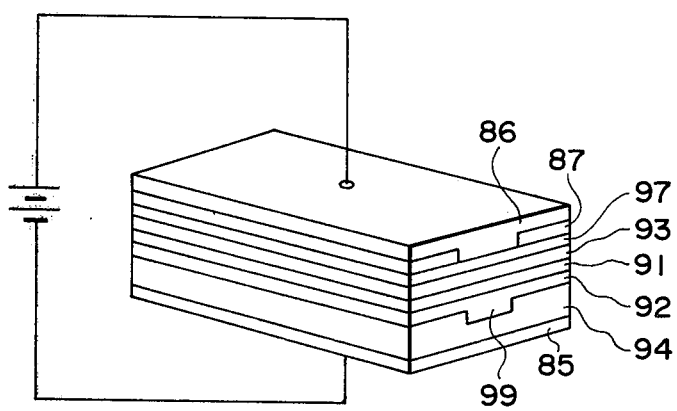

A light-absorbing member is formed on each of both the sides of a predetermined stripe portion of a layer sandwiching the active layer from both the sides so that the loss on both the sides of the stripe is increased and expansion of the lateral mode is prevented. Furthermore, change of the refractivity, that is, the effective complex refractive index, is caused in both the sides of the stripe. By change of the effective complex refractive index in the lateral direction, expansion of the lateral mode can be prevented. This example is illustrated in FIG. 10. A stripe groove having a predetermined width, for example, about 10 μm, is formed on a GaAsP substrate 94. This processing can easily be accomplished by using a solution of phosphoric acid, hydrogen peroxide and ethylene glycol. Then, a first cladding layer 92 of $Ga_p-Al_{1-p}As_qP_{1-q}$ ($0 \leq p \leq 0.91$ and $0.47 \leq q \leq 1.0$), an active layer 91 of $Ga_yIn_{1-y}As_xP_{1-x}$ ($0.52 \leq y \leq 1.0$ and $0 \leq x \leq 1.0$), a layer 93 of the conducting type reverse to that of the first cladding layer, which is composed of $Ga_{p'}Al_{1-p'}As_{q'}P_{1-q'}$ ($0 \leq p' \leq 0.91$ and $0.47 \leq q' \leq 1.0$), and a layer 97 of GaAs are grown on the substrate 94. In this structure, light bleeding from both the sides of the stripe 99 arrives at the GaAsP substrate to form a region where the effective complex refractive index is changed, whereby expansion of the lateral mode can be prevented. The stripe 99 may be formed by first forming a stripe-forming layer on the substrate and then removing a portion having a width corresponding to the stripe width. This arrangement for causing a change of the effective complex refractive index may be made in the second cladding layer or both of the first and second cladding layers.

Various other modifications may be made without departing from the spirit and scope of the invention.

What is claimed is:

1. In a semiconductor laser device comprising a semiconductor substrate composed of $GaAs_tP_{1-t}$ ($0.54 \leq t < 1.0$), a first semiconductor layer of a first conducting type formed on the substrate and composed of $Ga_pAl_{1-p}As_qP_{1-q}$ ($0 \leq p \leq 0.91$ and $0.47 \leq q \leq 1.0$), a second semiconductor layer formed on said first semiconductor layer and composed of $Ga_yIn_{1-y}As_xP_{1-x}$ ($0.52 \leq y \leq 1.0$ and $0 \leq x \leq 1.0$), a third semiconductor layer of a conducting type reverse to that of the first semiconductor layer, which is formed on said second semiconductor layer and is composed of $Ga_{p'}Al_{1-p'}As_{q'}P_{1-q'}$ ($0 \leq p' \leq 0.91$ and $0.47 \leq q' \leq 1.0$), said second semiconductor layer containing at least one optical confinement region having a higher refractivity than those of the first and third semiconductor and a band gap smaller than those of the first and third semiconductor layers.

2. A device as set forth in claim 1 wherein the thickness of said second semiconductor layer is 0.05 to 3.0 μm.

3. A semiconductor laser device comprising a semiconductor substrate composed of $GaAs_tP_{1-t}$ ($0.54 \leq t < 1.0$), a first semiconductor layer of a first conducting type formed on the substrate and composed of $Ga_pAl_{1-p}As_qP_{1-q}$ ($0 \leq p \leq 0.91$ and $0.47 \leq q \leq 1.0$), a second semiconductor layer formed on said first semiconductor layer and composed of $Ga_yIn_{1-y}As_xP_{1-x}$ ($0.52 \leq y \leq 1.0$ and $0 \leq x \leq 1.0$), a third semiconductor layer of a conducting type reverse to that of the first semiconductor layer, which is formed on said second semiconductor layer and is composed of $Ga_{p'}Al_{1-p'}As_{q'}P_{1-q'}$ ($0 \leq p' \leq 0.91$ and $0.47 \leq q' \leq 1.0$), said second semiconductor layer containing at least one optical confinement region having a higher refractivity than those of the first and third semiconductor and a band gap smaller than those of the first and third semiconductor layers;

a first electrode coupled to said third semiconductor layer;

a second electrode coupled to said semiconductor substrate; and means, including said optical confinement region, for forming a resonant optical cavity for optical radiation.

4. A device as set forth in claim 3, wherein the thickness of said second semiconductor layer is 0.05 to 3.0 μm.

5. A device as set forth in claim 3, wherein said first electrode is coupled to said third semiconductor layer through a fourth semiconductor layer formed on said third semiconductor layer and composed of GaAsP.

6. A device as set forth in claim 1, 2, 3 or 4 wherein the difference of the band gap between the second semiconductor layer and the first and third semiconductor layers is at least 0.3 eV.

* * * * *